(12) United States Patent
Bolandrina et al.

(10) Patent No.: US 10,504,590 B2
(45) Date of Patent: *Dec. 10, 2019

(54) MEMORY DEVICE WITH REDUCED NEIGHBOR MEMORY CELL DISTURBANCE

(71) Applicant: Micron Technology, Inc., Boise, ID (US)

(72) Inventors: Efrem Bolandrina, Alzano Lomardo (IT); Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/109,066

(22) Filed: Aug. 22, 2018

(65) Prior Publication Data
US 2019/0013072 A1 Jan. 10, 2019

Related U.S. Application Data

(63) Continuation of application No. 15/691,482, filed on Aug. 30, 2017, now Pat. No. 10,083,744, which is a
(Continued)

(51) Int. Cl.
*G11C 7/00* (2006.01)
*G11C 13/00* (2006.01)
*G11C 11/16* (2006.01)

(52) U.S. Cl.
CPC ...... *G11C 13/0033* (2013.01); *G11C 11/1653* (2013.01); *G11C 11/1655* (2013.01); *G11C 11/1657* (2013.01); *G11C 11/1659* (2013.01); *G11C 11/1673* (2013.01); *G11C 11/1693* (2013.01); *G11C 13/0002* (2013.01); *G11C 13/004* (2013.01); *G11C 13/0004* (2013.01); *G11C 13/0023* (2013.01); *G11C 13/0026* (2013.01); *G11C 13/0028* (2013.01); *G11C 13/0069* (2013.01); *G11C 2213/79* (2013.01)

(58) Field of Classification Search
CPC .................................................. G11C 13/0004
USPC ......................................................... 365/204
See application file for complete search history.

(56) References Cited

U.S. PATENT DOCUMENTS 7,907,442 B2   3/2011  Kitai et al.
8,243,497 B1   8/2012  Pellizzer et al.
(Continued)

OTHER PUBLICATIONS

Villa et al. "A 45nm 1Gb 1.8V Phase-Change Memory," 2010 IEEE International Solid-State Circuits Conference, Feb. 7-11, 2010, pp. 270-271, IEEE.

*Primary Examiner* — Hoai V Ho
(74) *Attorney, Agent, or Firm* — Holland & Hart LLP (57) ABSTRACT

In one embodiment, an apparatus, such as a memory device, is disclosed. The apparatus includes a memory cell, digit line driver, access line driver, clamping element, and control circuit. The memory cell and clamping element can be both coupled to a digit line. The control circuit can be configured to cause the clamping element to clamp the voltage of the digit line for a period of time while the digit line driver is caused to bias the digit line at a voltage level sufficient to enable selection of the memory cell. In addition, the control circuit can be configured to cause the access line driver to bias an access line coupled to memory cell when the voltage of the digit line is at the voltage level sufficient to enable selection of the memory cell.

20 Claims, 7 Drawing Sheets

Related U.S. Application Data continuation of application No. 15/210,391, filed on Jul. 14, 2016, now Pat. No. 9,767,898, which is a continuation of application No. 14/679,745, filed on Apr. 6, 2015, now Pat. No. 9,418,735, which is a continuation of application No. 14/132,390, filed on Dec. 18, 2013, now Pat. No. 9,025,392.

(56) References Cited

U.S. PATENT DOCUMENTS

| | | |
|---|---|---|
| 8,243,542 B2 | 8/2012 | Bae et al. |
| 9,025,392 B1 | 5/2015 | Bolandrina et al. |
| 9,418,735 B2 | 8/2016 | Bolandrina et al. |
| 9,525,007 B2 | 12/2016 | Pellizzer et al. |
| 9,767,898 B2 | 9/2017 | Bolandrina et al. |
| 10,083,744 B2 * | 9/2018 | Bolandrina et al. ......... G11C 13/0033 |

* cited by examiner

MEMORY DEVICE WITH REDUCED NEIGHBOR MEMORY CELL DISTURBANCE

CROSS REFERENCES

The present Application for Patent is a continuation of U.S. patent application Ser. No. 15/691,482, by Bolandrina et al., entitled "Memory Device With Reduced Neighbor Memory Cell Disturbance," filed Aug. 30, 2017, which is a continuation of U.S. patent application Ser. No. 15/210,391 by Bolandrina et al., entitled "Memory Device With Reduced Neighbor Memory Cell Disturbance," filed Jul. 14, 2016, which is a continuation of U.S. patent application Ser. No. 14/679,745 by Bolandrina et al., entitled "Memory Device with Reduced Neighbor Memory Cell Disturbance," filed Apr. 6, 2015, which is a continuation of U.S. patent application Ser. No. 14/132,390 by Bolandrina et al., entitled "Memory Device with Reduced Neighbor Memory Cell Disturbance," filed Dec. 18, 2013, assigned to the assignee hereof, and each of which is expressly incorporated by reference in its entirety herein.

TECHNICAL FIELD

Embodiments of the present disclosure generally relate to integrated circuits and more specifically to a phase change memory device with reduced neighbor memory cell disturbance.

BACKGROUND

There are many different types of memory, including random-access memory (RAM), read only memory (ROM), dynamic random access memory (DRAM), synchronous dynamic random access memory (SDRAM), resistive memory, and flash memory, among others. Types of resistive memory include phase change memory, programmable conductor memory, and resistive random access memory (RRAM), among others. Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices. Various resistive memory devices can include arrays of cells organized in a cross-point architecture. In such architectures, the memory cells can include a cell stack comprising a storage component, for example, a phase change element, in series with a select device, for example, a switching element such as an ovonic threshold switch (OTS) or diode, between a pair of conductive lines, for example, between an access line and a data/sense line.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized. Furthermore, structural and/or logical changes may be made without departing from the scope of claimed subject matter. It should also be noted that directions and/or references, for example, up, down, top, bottom, and so on, may be used to facilitate discussion of drawings and are not intended to restrict application of claimed subject matter.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses and/or systems that would be known by one of ordinary skill have not been described in detail so as not to obscure claimed subject matter.

Memory devices may utilize cross-point arrays to efficiently store and retrieve data. The cross-point arrays can include multiple memory cells, such as thousands of memory cells, arranged in an array structure. Memory cells can be selected from the cross-point arrays by applying voltages to digit line conductors and access line conductors corresponding to individual memory cells. A selected memory cell may then be accessed by an access circuit associated with the memory cell.

As the size of cross-point arrays decrease due to improvements in technology, the distance between neighboring digit line conductors of the memory arrays also decreases, increasing coupling capacitances between the neighboring digit line conductors. With greater amounts of coupling capacitances between the neighboring digit line conductors, current and voltage pulses used to select memory cells can disturb neighboring memory cells in a memory array and thus reduce the reliability of the neighboring memory cells and the memory array as a whole.

In some systems, the digit line conductors connected to non-selected memory cells can be clamped (for instance, by controlling the voltages of the digit line conductors) so as to reduce the impact of pulses used to select a memory cell. For example, when a pulse is used to select one memory cell connected to a selected digit line, the voltages of digit lines adjacent to the selected digit line can be clamped to prevent programming of the memory cells connected to the adjacent digit lines. On the other hand, any clamps connected to the selected digit line may not clamp while the pulse is supplied to the selected digit line so that the memory cell can be successfully selected. In one such example, the system utilizes a chessboard-like pattern of clamps positioned two clamp word line conductors. One clamp word line conductor is connected to clamps on every even bit line conductor in a cross-point array, and another clamp word line conductor is connected to clamps on every odd bit line conductor in the cross-point array. However, this chessboard-like pattern of clamps, in some cases, can be difficult to implement because the pattern utilizes a discontinuous positioning of clamps, which may be difficult to manufacture in relatively small cross-point arrays.

Accordingly, in some embodiments of the present disclosure, a cross-point array is provided with a continuous pattern of clamps connected to digit lines in the cross-point array. The timing and/or voltages of the digit and access line conductors of the cross-point array can be intelligently controlled so as to prevent disturbing neighboring memory cells when a memory cell on in the cross-point array may be selected or accessed.

Integrated circuits, such as integrated circuit memory devices, include multiple layers of material typically built on a substrate. The material layers include conductive metal layers, also known as metal levels, which interconnect circuit devices. Elongated conductive lines of metal levels in an integrated circuit include interconnects as well as electrodes for semiconductor devices (for example, access lines and digit lines for addressing memory cells, which can include switches and/or memory storage components-access lines and digit lines can also be referred to as word lines and bit lines). Conductive lines formed from a layer or layers at the same vertical level can be referred to collectively as a metal level, and the lines can be referred to as metal lines or wires, even though the material may be formed from non-metal conductors such as doped semiconductor layers (for example, polysilicon or doped crystalline silicon) or metallic alloys such as metal nitrides, metal carbides and metal silicides. Contacts formed between metal levels can be referred to as vertical connectors. Such vertical connectors can be formed separately from the conductive lines they connect, or can be simultaneously formed with overlying conductive lines in a dual damascene process.

References herein to memory "bit lines" are more generally applicable to digit lines that are not limited to binary memory storage. Furthermore, bit lines can be referred to as column electrodes, and references to bit line drivers and driver regions herein are applicable to column drivers and driver regions. Similarly, access or word lines can be referred to as row electrodes, and references herein to word line drivers and driver regions are applicable to row drivers and driver regions. The skilled artisan will appreciate that row column electrodes need not be perpendicular; rather, an array can be configured in a manner in which the row and column electrodes cross one another at non-perpendicular angles.

A memory device may include memory cells arranged in an array format. A memory array generally may include two conductive, or semi-conductive, crossing (for example, orthogonal) lines referred to as an access line (for example, word line) and a digit line (for example, bit line) that are used to select a memory cell to access (for example, program and read) the memory cell. The word lines and bit lines can also serve as electrodes for the memory cells and so can be referred to as electrode lines, or more simply as electrodes. Although different types of memory cells may be accessed in different manners, word lines and bit lines are typically coupled to respective word line and bit line driver circuitry, also known as row and column drivers. As used herein, the term "substrate" may include silicon-on-insulator (SOI) or silicon-on-sapphire (SOS) technology, doped and undoped semiconductors, epitaxial layers of silicon supported by a base semiconductor foundation, complementary metal oxide semiconductors (CMOS), for example, a CMOS front end with a metal back end, and/or other semiconductor structures and technologies. Various circuitry, such as decode circuitry, for example, associated with operating memory array may be formed in and/or on the substrate.

Figure 1:
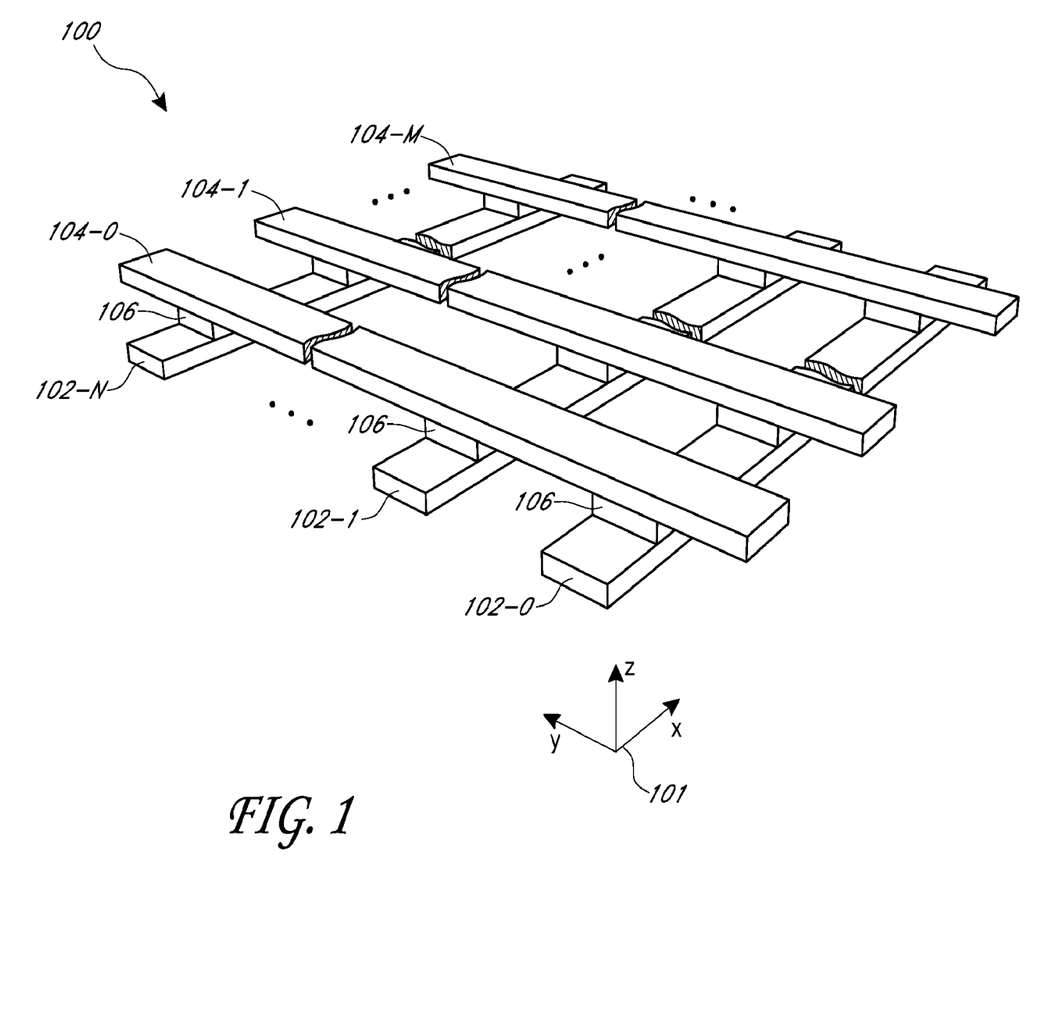
FIG. 1 is an illustration depicting a perspective view of a portion of an example memory array.

FIG. 1 illustrates a perspective view of a portion of a memory array 100. In this example, memory array 100 may comprise a cross-point array including memory cells 106 positioned at intersections of a first set of conductive lines 102-0, 102-1, ..., 102-N, for example, access lines, which may be referred to herein as word lines, and a second set of conductive lines 104-0, 104-1, ..., 104-M, for example, data lines, which may be referred to herein as bit or digit lines. Coordinate axis 101 indicates that the bit lines 104-0, 104-1, ..., 104-M are oriented in an y-direction and the word lines 102-0, 102-1, ..., 102-N are oriented in a x-direction, in this example. As illustrated, the word lines 102-0, 102-1, ..., 102-N are substantially parallel to each other and are substantially orthogonal to the bit lines 104-0, 104-1, ..., 104-M, which are substantially parallel to each other; however, embodiments are not so limited, and word lines and bit lines can have non-perpendicular orientations. As used herein, the term "substantially" intends that the modified characteristic need not be absolute, but is close enough so as to achieve the advantages of the characteristic. For example, "substantially parallel" is not limited to absolute parallelism, and may include orientations that are at least closer to a parallel orientation than a perpendicular orientation. Similarly, "substantially orthogonal" is may include orientations that are closer to a perpendicular orientation than a parallel orientation. Further, in some implementations, a cross-point array can be oriented in a vertical direction such that bit lines and word lines may lie on a plane perpendicular or substantially perpendicular to the plane of the substrate.

Cross-point array 100 may comprise an array structure. As an example, memory cells 106 may comprise phase change random access memory (PCRAM) cells, resistive random access memory (RRAM) cells, conductive bridge random access memory (CBRAM) cells, and/or spin transfer torque random access memory (STT-RAM) cells, among other types of memory cells. In various embodiments, memory cells 106 may comprise a "stack" structure that includes a select device, for example, a switching device, coupled in series to a storage component, for example, a resistive storage component comprising a phase change material or metal oxide. As an example, the select device may comprise a diode, a field effect transistor (FET), a bipolar junction transistor (BJT), or an ovonic threshold switch (OTS), among other switching elements.

In a number of embodiments, a select device and storage component associated with a respective memory cell 106 may comprise series coupled two-terminal devices. For instance, a select device may comprise a two-terminal Ovonic Threshold Switch (OTS), for example, a chalcogenide alloy formed between a pair of electrodes, and the storage component may comprise a two-terminal phase change storage component, for example, a phase change material (PCM) formed between a pair of electrodes. In a number of embodiments, an electrode may be shared between a select device and a storage component of a memory cell 106. A heater element can further be included, in some embodiments. Also, in a number of embodiments, the bit lines 104-0, 104-1, . . . , 104-M and the word lines 102-0, 102-1, . . . , 102-N may serve as top and bottom electrodes corresponding to the memory cells 106.

As used herein, "storage component" or "storage element" may refer to a programmable portion of a memory cell 106, for example, the portion programmable to different data states. For instance, in PCRAM and RRAM cells, a storage component may include a portion of a memory cell having a resistance that is programmable to particular levels corresponding to particular data states responsive to applied programming signals, for example, voltage and/or current pulses. A storage component may include, for example, one or more resistance variable materials, such as a phase change material. As an example, a phase change material may comprise a chalcogenide alloy such as an indium(In)-antimony(Sb)-tellurium(Te) (IST) material, for example, $In_2Sb_2Te_5$, $In_1Sb_4Te_4$, $In_1Sb_4Te_7$, etc., or a germanium(Ge)-antimony(Sb)-tellurium(Te) (GST) material, for example, $Ge_8Sb_5Te_8$, $Ge_2Sb_2Te_5$, $Ge_1Sb_2Te_4$, $Ge_1Sb_4Te_7$, $Ge_4Sb_4Te_7$, etc., among other phase change materials. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other examples of resistance variable materials may include transition metal oxide materials and/or alloys including two or more metals, for example, transition metals, alkaline earth metals, and/or rare earth metals. Embodiments are not limited to a particular resistive variable material or materials associated with the storage components of the memory cells 106. For instance, other examples of resistive variable materials that may be used to form storage components include binary metal oxide materials, colossal magneto-resistive materials, and/or various polymer-based resistive variable materials, among others. Moreover, in some implementations, a "storage component" can further include a selection device incorporated into a memory cell. Although not illustrated in FIG. 1, in a number of embodiments, memory array 100 may be implemented as part of a three dimensional (3D) architecture, with a number of memory arrays 100 vertically stacked on each other, for example, or with a number of memory arrays 100 stacked side-to-side on a plane perpendicular to the plane of the substrate.

Figure 2:
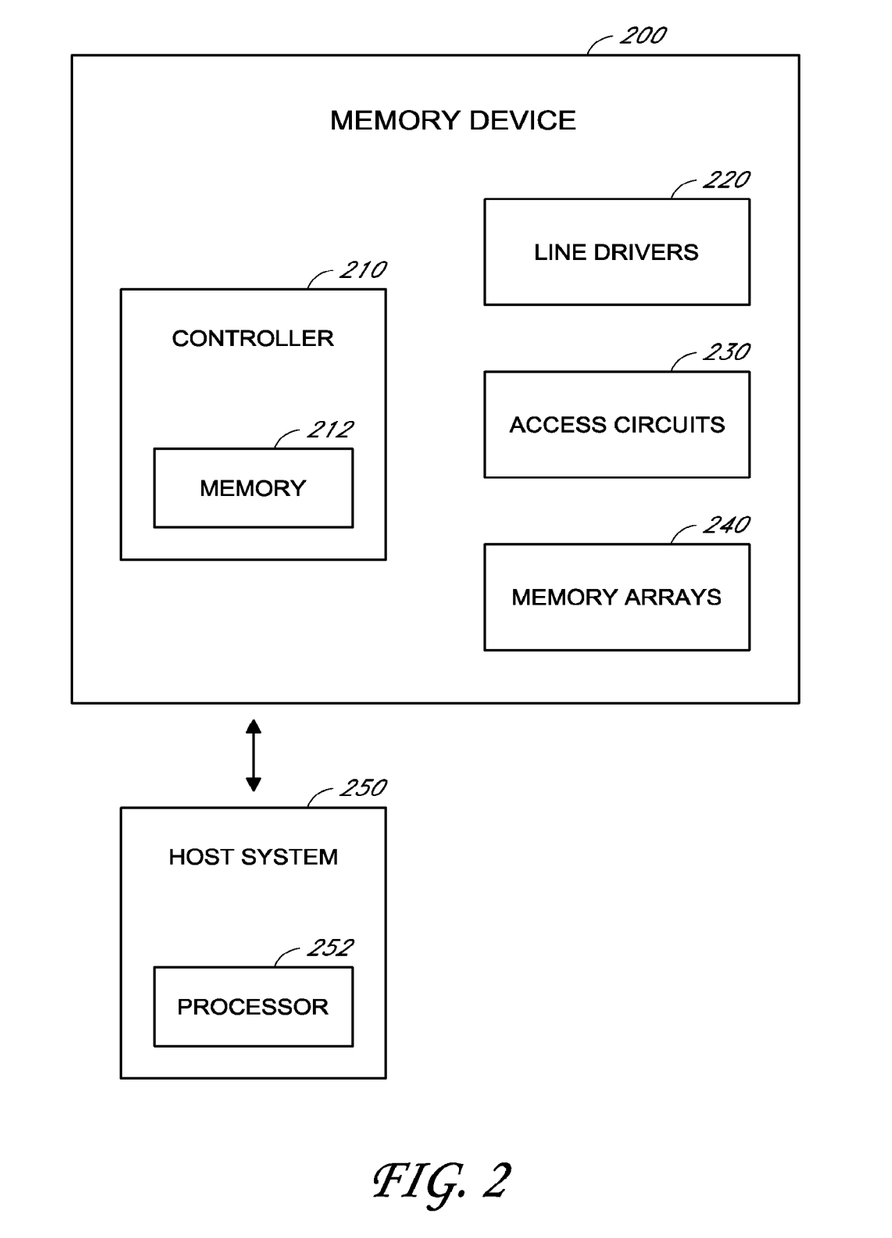
FIG. 2 is an illustration depicting a block diagram of an example memory device in communication with a host system.

FIG. 2 is an illustration depicting a block diagram of an example memory device 200 in communication with a host system 250. The memory device 200 includes a controller 210, line drivers 220, access circuits 230, and memory arrays 240. The memory device 200 can be configured to implement one or more of the features described herein to reduce disturbances to neighboring memory cells when a memory cell of the memory arrays 240 may be selected.

The controller 210 can be a control circuit and manage selecting and accessing of memory cells of the memory arrays 240. The memory arrays 240 can, for example, include memory arrays such as the memory array 100 of FIG. 1. The controller 210 can determine storage addresses of the memory arrays 240 to access where the storage addresses correspond to particular physical memory cells of the memory arrays 240. The controller 210 can transmit address selection signals indicative of the storage addresses to the line drivers 220 and cause the line drivers 220 to bias or supply currents to bit line conductors and/or word line conductors to select the particular physical memory cells. In addition to the address selection signals, the controller 210 may transmit to the access circuits 230 access instructions, such as whether to read or program memory cells, and accompanying data to be written to the selected memory cells. In response to the access instructions and address selection signals, the controller 210 can receive confirmation of successful selecting and/or accessing of the memory cells or data retrieved from the selected memory cells. In some embodiments, advantageously, the timing of the line drivers 220 and/or access circuits 230 can be controlled so that the selection and/or access of one memory cell may not change the memory state of one or more neighboring memory cells of the memory arrays 240.

A memory 212 can be used by the controller 210 to store one or more logical-to-physical address mapping tables or memory array addresses. The memory 212 may contain one or more previously selected storage addresses or one or more next storage addresses to be selected by the controller 210. The controller 210 can store the addresses in the memory 212 to facilitate transmission of the address selection signals through the line drivers 220 and determination of next address addresses to select and access. Additionally, although the memory 212 is part of the controller 210 in the illustrated embodiment, the memory 212 may be separate from the controller 210 in some implementations.

The memory device 200 can be configured to communicate with a host system 250 including a host processor 252. The host system 250 can be one or more of a computer, mobile phone, electronic game, camera, music player, or the like and include other components that enable associated functions for the host system 250. The memory device 200 can function as a memory storage for the host system 250 and receive storage access commands from the host system 250. In response to the storage access commands, the memory device 200 can provide confirmation of execution and/or date retrieved from the memory arrays 240. Although the memory device 200 is illustrated as separate from the host system 250 in FIG. 2, in some embodiments, the memory device 200 can be part of the host system 250.

Figure 3:
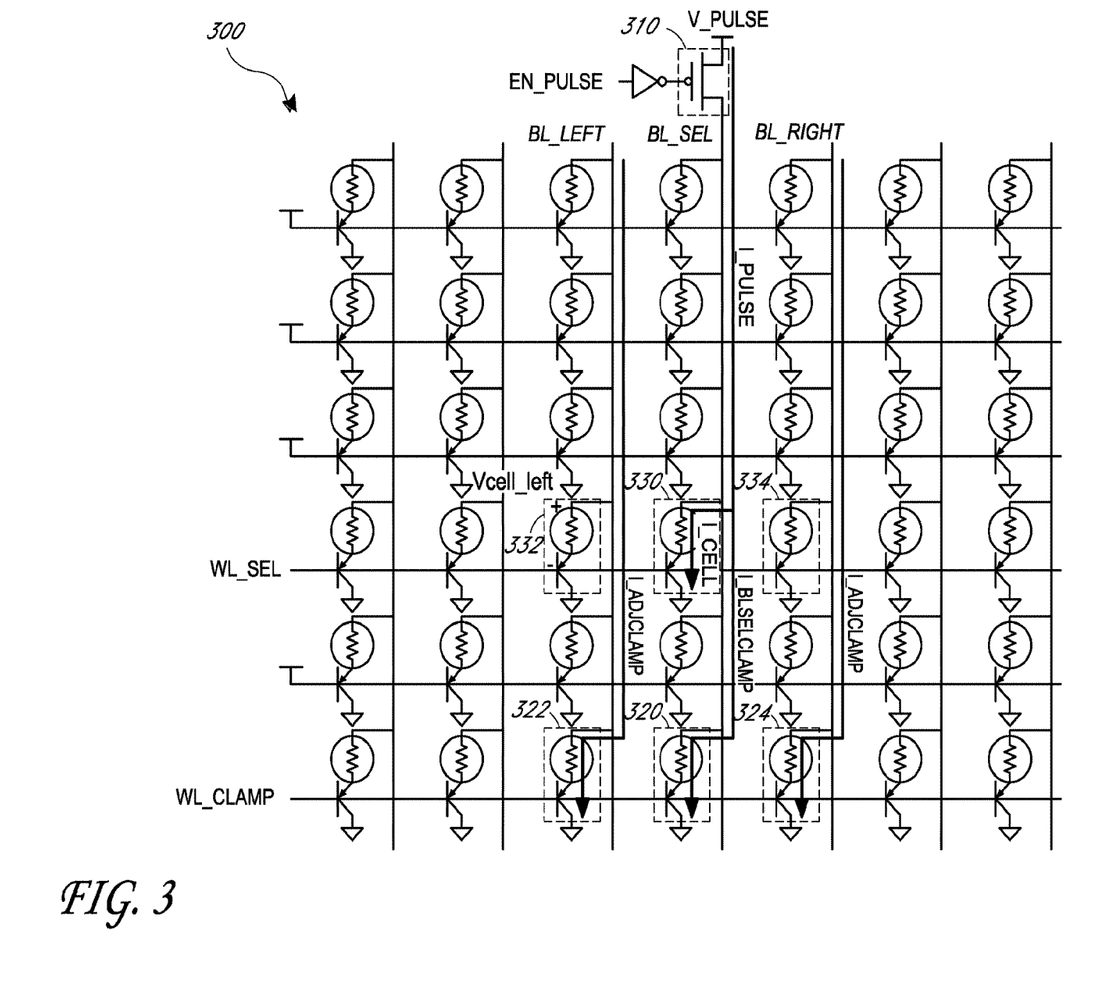
FIG. 3 is an illustration depicting a portion of an example memory array architecture having a single clamp word line for reduced neighbor memory cell disturbance.

FIG. 3 is an illustration depicting a portion of an example memory array architecture 300 having a single clamp word line for reduced neighbor memory cell disturbance. The architecture 300 can be part of the memory arrays 240 of FIG. 2, for example. The architecture 300 includes a current source 310, clamps 320, 322, and 324 (sometimes referred to as discharging elements), and memory cells 330, 332, and 334. The clamps 320, 322, and 324 and memory cells 330, 332, and 334 can each include a memory cell, such as the memory cell 106 of FIG. 1, for example, including a storage element and a select element, or the like. The clamps 320, 322, and 324 can each have a clamping effect on a voltage of a respective bit line coupled to the clamps 320, 322, and 324, even if the voltage may not be limited to a precise or predefined value as result of the clamping. The voltages and currents of the bit lines and word lines in the architecture 300 can be controlled, for instance, by the controller 210 and the line drivers 220 of FIG. 2.

The clamps 320, 322, and 324 are each operatively coupled to the word line WL_CLAMP, and the memory cells 330, 332, and 334 are each operatively coupled to the word line WL_SEL. The activation of the clamps 320, 322, and 324 can be controlled by applying a bias to the word line WL_CLAMP, and the activation of the memory cells 330, 332, and 334 can be controlled by applying a bias to the word line WL_SEL. The clamp 320 and the memory cell 330 are each operatively coupled to the bit line BL_SEL. The clamp 322 and the memory cell 332 are each operatively coupled to the bit line BL_LEFT, and the clamp 324 and the memory cell 334 are each operatively coupled to the bit line BL_RIGHT. Although one current source 310 is illustrated in FIG. 3, a current source similar to the current source 310 can be connected to each of the bit lines of the architecture 300, such as bit lines BL_LEFT and BL_RIGHT, for instance. The clamps 320, 322, and 324 can further each be coupled to an end of their respective bit lines opposite from where the current source connected to respective bit line may be positioned. According to other embodiments, one or more additional word lines WL_CLAMP with respective clamps at intersections with bit lines are placed in different positions of the architecture 300 and activated in parallel, so that a maximum distance between any memory cell in the array and a clamp is kept below a value, such as a predetermined value. In some embodiments, the clamps 320, 322, and 324 can each be either in a set or unset state (for example, in a relatively more conductive or relatively less conductive state, respectively). In particular embodiments, the clamps 320, 322, and 324 can each be initiated to a set state.

The current source 310 can be part of the line drivers 220 of FIG. 2 and include a transistor connected to a supply voltage V_PULSE and a driving voltage EN_PULSE via an amplifier. The current source 310 can supply a current and bias voltage to the bit line BL_SEL at a level sufficient to enable selection of the memory cells connected to the bit line BL_SEL, such as the memory cell 330. As illustrated in FIG. 3, the current source 310 can supply a current I_PULSE to the bit line BL_SEL. When the clamp 320 is caused to conduct current by applying a bias to the word line WL_CLAMP, some or all of the current I_PULSE can flow as a current I_BLSELCLAMP through the clamp 320. When the memory cell 330 is caused to conduct current by applying a bias to the word line WL_SEL, some or all of the current I_PULSE can flow as a current I_CELL through the memory cell 330. The current I_PULSE and the voltage V_BLSEL can additionally cause currents I_ADJCLAMP and voltages V_BLADJ in the bit lines BL_LEFT and BL_RIGHT that neighbor the bit line BL_SEL as a result of capacitive coupling. When the clamps 322 and 324 are caused to conduct current by applying a bias to the word line WL_CLAMP, some or all of the currents I_ADJCLAMP can flow through the clamps 322 and 324. Furthermore, when a bias may be applied to the word line WL_SEL, the other memory cells, such as the memory cells 332 and 334, connected to the word line WL_SEL can undesirably be caused to conduct a current if the voltage V_BLADJ may exceed a threshold voltage.

Figure 4:
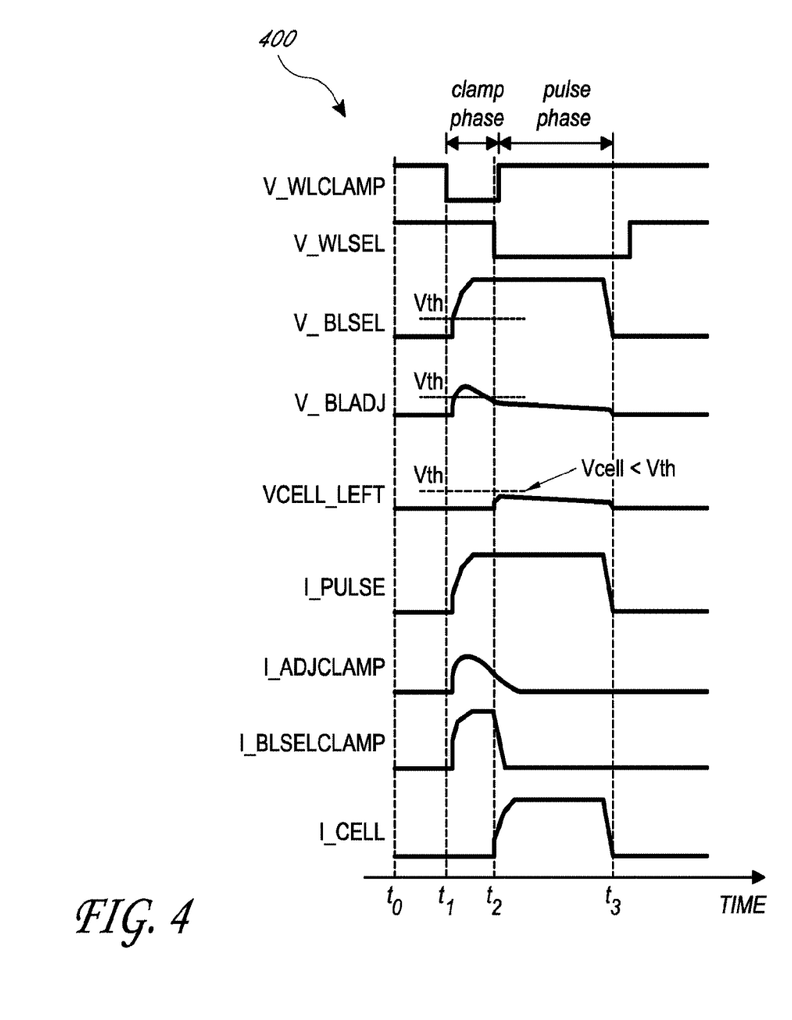
FIG. 4 is an illustration depicting an example timing diagram for the memory array architecture of FIG. 3.

FIG. 4 is an illustration depicting an example timing diagram 400 of voltages and currents in the architecture 300 of FIG. 3, according to one embodiment. At time to, the current source 310 is not supplying the current I_PULSE to the bit line BL_SEL, and the word lines WL_CLAMP and WL_SEL are not biased. At time $t_1$, the clamp phase begins. The voltage V_WLCLAMP of the word line WL_CLAMP transitions from not being biased to being biased, causing the clamps connected to the word line WL_CLAMP, including clamps 320, 322, and 324, to conduct electrical current from the respective bit lines connected to the clamps. For example, the voltage V_WLCLAMP of the word line WL_CLAMP can be biased to 0 Volts or a negative voltage, such as −2 Volts.

At time $t_1$ or shortly after (for example, less than a few nanoseconds after), the current source 310 transitions from not supplying to supplying the current I_PULSE to the bit line BL_SEL, and the voltage V_BLSEL of the bit line BL_SEL begins to increase. The current I_PULSE and the voltage V_BLSEL further cause the currents I_ADJCLAMP and the voltages V_BLADJ in the bit lines BL_LEFT and BL_RIGHT to change due to capacitive coupling. Because the word line WL_CLAMP is biased, the clamp 320 conducts the current I_BLSELCLAMP, and the clamps 322 and 324 conduct the current I_ADJCLAMP.

As can be seen from the V_BLADJ plot, the voltages V_BLADJ of the bit lines BL_LEFT and BL_RIGHT may exceed a threshold voltage Vth for a short time during the clamp phase. The threshold voltage Vth, in some embodiments, can be a voltage level at which the memory cells connected to the bit lines BL_LEFT and BL_RIGHT can be typically considered selected. Moreover, if the voltage of the word lines connected to particular memory cells of the BL_LEFT and BL_RIGHT may also be biased, the particular memory cells can susceptible a memory state change (for example, from a set to unset state or vice versa) or be responsive to memory operations by an access circuit. Accordingly, when the voltages of the bit lines BL_LEFT and BL_RIGHT exceed a threshold and then a bias voltage is applied to the word line WL_SEL, the memory cells 332 and 334 may be disturbed, and the memory state of the memory cells 332 and 334 in some cases can undesirably be changed. However, as illustrated by the timing diagram 400, the electrical energy in the bit lines BL_LEFT and BL_RIGHT can be discharged through the clamps 322 and 324, by activating the clamps 322 and 324, to bring the voltages V_BLADJ back to a level below the threshold voltage Vth.

At time $t_2$, the voltage V_WLSEL of the word line WL_SEL transitions from being not biased to being biased, causing the memory cell 330 connected to the word line WL_SEL to conduct electrical current from the bit line BL_SEL. In some embodiments, time $t_2$ can occur at a set or determined time after time $t_1$. For example, time $t_2$ can be triggered at a time after which the voltage V_BLADJ is expected or known to have decreased below the threshold voltage Vth. The voltage V_BLADJ may be determined to be below the threshold voltage Vth, for instance, based on the materials used to construct the architecture 300, previously conducted experiments, and/or by measuring the voltage V_BLADJ of the architecture 300 using a voltage sensing circuit. Time $t_2$ accordingly can be, for instance, a few nanoseconds, such as less than 15 nanoseconds, after time $t_1$.

As can be seen from the V_BLADJ plot, the voltages V_BLADJ of the bit lines BL_LEFT and BL_RIGHT can be below the threshold voltage Vth by time $t_2$. Thus, when the voltage V_WLSEL of the word line WL_SEL transitions to being biased, the voltage VCELL_LEFT across the memory cell 332 can be below a threshold voltage for selecting the memory cell 332 and enabling an access of operation for the memory cell 332. Similarly, when the voltage V_WLSEL of the word line WL_SEL transitions to being biased, the voltage VCELL_LEFT across the memory cell 334 can be below a threshold voltage for selecting the memory cell 334 and enabling an access of operation for the memory cell 334. On the other hand, the voltage V_BLSEL of the bit line BL_SEL can exceed the threshold voltage Vth by time $t_2$. When the voltage V_WLSEL of the word line WL_SEL transitions to being biased, the voltage across the memory cell 330 can be above a threshold voltage for selecting the memory cell 330 and enabling an access operation for the memory cell 330.

At substantially the same time as time $t_2$ or shortly thereafter (for example, less than a few nanoseconds after), the clamp phase ends and the pulse phase begins. The voltage V_WLCLAMP of the word line WL_CLAMP transitions from being biased to not being biased, causing the clamps connected to the word line WL_CLAMP, including clamps 320, 322, and 324, to no longer conduct electrical current from the respective bit lines connected to the clamps. The word line WL_SEL, however, can remain biased so that the memory cell 330 may continue to conduct electrical current.

Shortly before time $t_3$ and the end of the pulse phase (for example, less than a few nanoseconds before), the current source 310 transitions from supplying to not supplying the current I_PULSE to the bit line BL_SEL, and the voltage V_BLSEL of the bit line BL_SEL begins to decrease. At time $t_3$, the pulse phase ends. In some embodiments, the pulse phase can be of a time duration sufficient to enable the access operation for the memory cell 330. Shortly after time $t_3$ and the end of the pulse phase (for example, less than a few nanoseconds after), the voltage V_WLSEL of the word line WL_SEL transitions from being biased to not being biased, causing the memory cells connected to the word line WL_SEL, including memory cells 330, 332, and 334, to no longer conduct electrical current from the respective bit lines connected to the memory cells.

As can be seen from the current I_BLSELCLAMP illustrated in FIG. 4, the clamp 320 can conduct a significant amount of current during the clamp phase. Moreover, each time the current source 310 may supply a current and bias voltage to the bit line BL_SEL, the clamp 320 can conduct this same amount of current. Over time, this repeated conducting of current by the clamp 320 can damage the clamp 320, for example, such that the clamp 320 may conduct current less effectively than an undamaged clamp or may not be able to maintain a set or unset state. Thus, in some implementations, the architecture 300 can include multiple clamp word lines having additional clamps, for example, to help reduce the wear on individual clamps or prevent use of individual clamps at certain times. For instance, a clamp, such as the clamp 320, that is used to conduct a bias current, such as the current I_PULSE, may not be used to conduct a current due to capacitive coupling, such as the current I_ADJCLAMP, on a particular bit line. In another example, more than one clamp may conduct current in parallel on a particular bit line to reduce the current conducted by each individual clamp.

Figure 5:
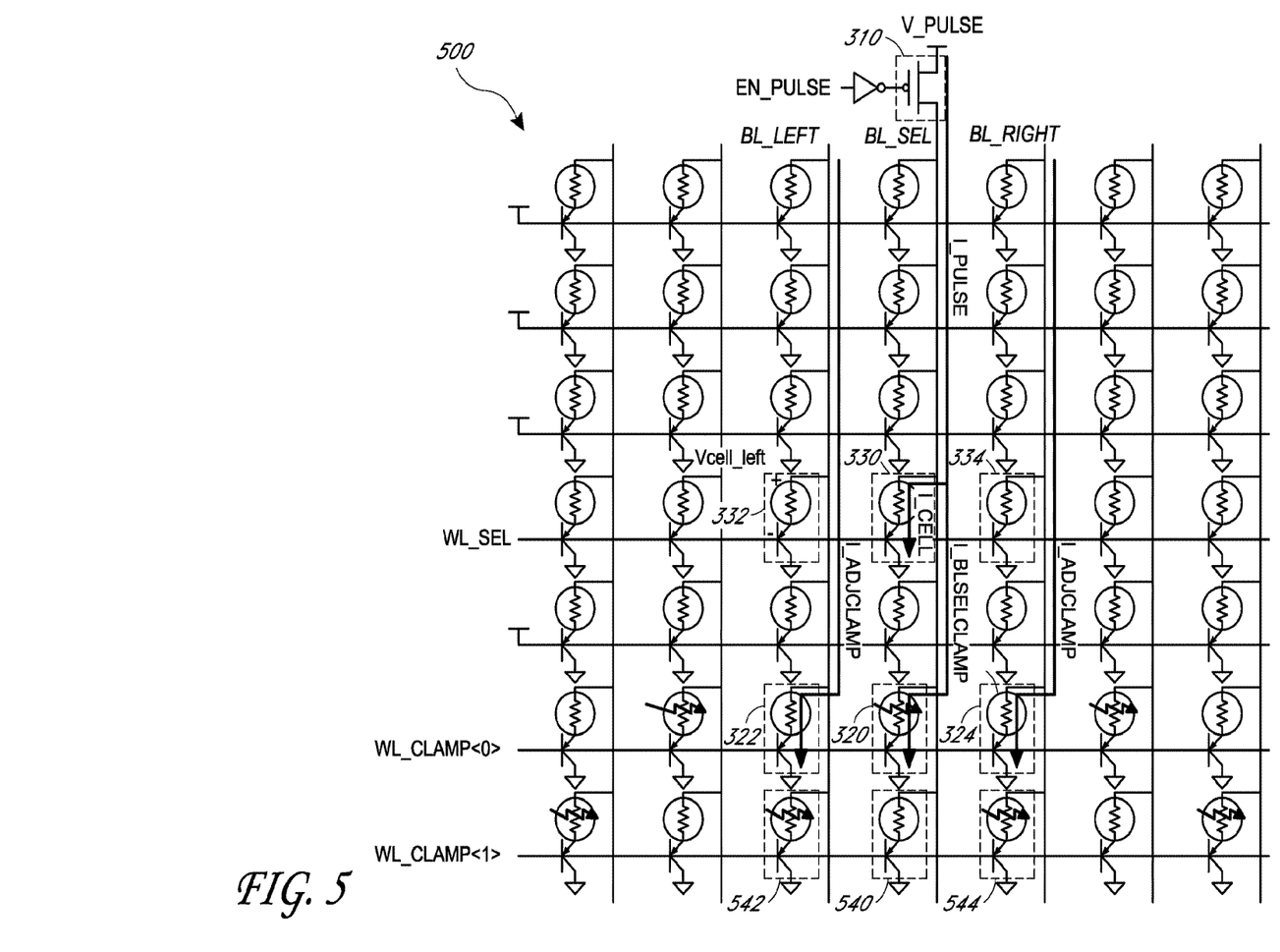
FIG. 5 is an illustration depicting a portion of an example memory array architecture having multiple clamp word lines for reduced neighbor memory cell disturbance.

FIG. 5 is an illustration depicting a portion of an example memory array architecture 500 having multiple clamp word lines for reduced neighbor memory cell disturbance. The architecture 500 includes the same components as the architecture 300 of FIG. 3; however, the architecture 500 further includes a clamp word line WL_CLAMP<1> in addition to the clamp word line WL_CLAMP<0>. The clamp word line WL_CLAMP<1> is operatively connected to the clamps 540, 542, and 544, and the clamp word line WL_CLAMP<0> s operatively connected to the clamps 320, 322, and 324. The activation of the clamps 320, 322, and 324 can by controlled by applying a bias to the word line WL_CLAMP<0>, and the activation of the clamps 540, 542, and 544 can by controlled by applying a bias to the word line WL_CLAMP<1>.

In some embodiments, particular clamp word lines of the multiple clamp word lines can be associated with particular bit lines of a memory array. This association can be used to determine which clamp word line(s) and clamp(s) may be used to conduct current for a selected bit line. For example, one clamp word line, such as the clamp word line WL_CLAMP<0>, can be associated with even bit lines of the architecture 500 while another clamp word line, such as the clamp word line WL_CLAMP<1>, can be associated with odd bit lines of the architecture 500, or vice versa. As illustrated in FIG. 5 by the lightning bolts drawn on the memory cells, the clamp word line WL_CLAMP<0> can be associated with even bit lines, including the bit line BL_SEL of the example. The clamp 320 thus can be assigned and selected to conduct current from the current source 310 during the clamp phase when selecting the memory cell 330. During this phase, the clamps 322 and 324 can also be selected and conduct current from the bit lines BL_LEFT and BL_RIGHT, adjacent to the selected one, limiting respective voltages and disturbs. In addition, the clamp word line WL_CLAMP<1> can be associated with odd bit lines, including the BL_LEFT and BL_RIGHT. The clamps 542 or 544 accordingly can be assigned and selected to conduct current during the clamp phase when selecting the memory cells 332 or 334, respectively. During this phase, the clamp 540 can conduct current from the bit line it is connected to, that is adjacent to the selected bit line, therefore limiting its voltage and possible disturb to the memory cell 330. Moreover, according to some embodiments, the word lines WL_CLAMP<0> and WL_CLAMP<1> can be placed at one edge of the memory array, but other placements are possible. According to other embodiments, the pair of word lines WL_CLAMP<0> and WL_CLAMP<1> with the respective clamps at intersections with bit lines can be placed in different positions of the memory array and activated in parallel, so that a maximum distance between any memory cell in the array and a clamp is kept below a predetermined value.

Figure 6:
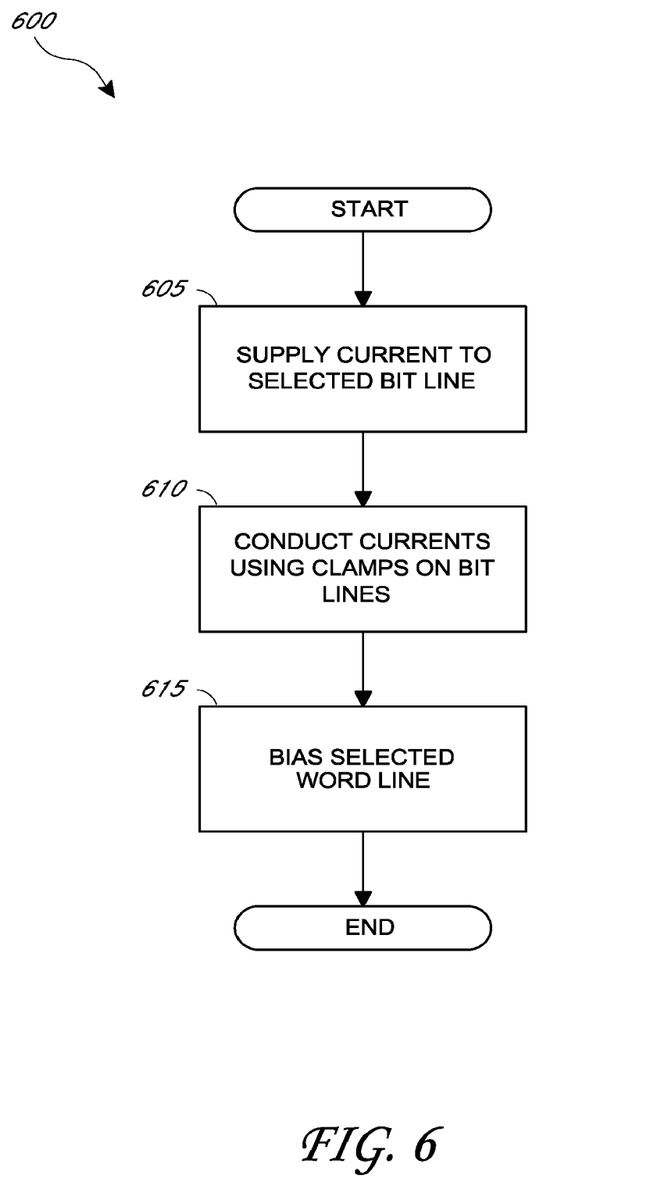
FIG. 6 is an illustration depicting an example process for reducing neighboring memory cell disturbance in a memory array.

FIG. 6 is an illustration depicting an example process 600 for reducing neighboring memory cell disturbance when selecting a memory cell in a memory array, such as the memory arrays 240 of FIG. 2. The process 600 can be performed using the architecture 300 of FIG. 3 or the architecture 500 of FIG. 5 under the control of the controller 210 and the line drivers 220 of FIG. 2, for example. The process 600 can enable a memory cell, such as memory cell 330, to be selected without disturbing neighboring memory cells, such as the memory cells 332 and 334.

At block 605, a current can be supplied to a selected bit line. For example, the controller 210 can instruct the line drivers 220 to supply a current and bias voltage to the bit line BL_SEL of the architecture 300. At block 610, currents can be conducted using clamps connected to the selected bit line and/or one or more neighboring bit lines. The controller 210 can, for instance, instruct the line drivers 220 to bias the clamp word line WL_CLAMP of the architecture 300 to cause the clamps 320, 322, and 324 to conduct currents for a set or determined duration of time. At block 615, a selected word line can be biased. In one example implementation, the controller 210 can instruct the line drivers 220 to bias the selected word line WL_SEL of the architecture 300 at substantially the same time or shortly before the controller instructs the line drivers 220 to stop biasing the clamp word line WL_CLAMP.

Figure 7:
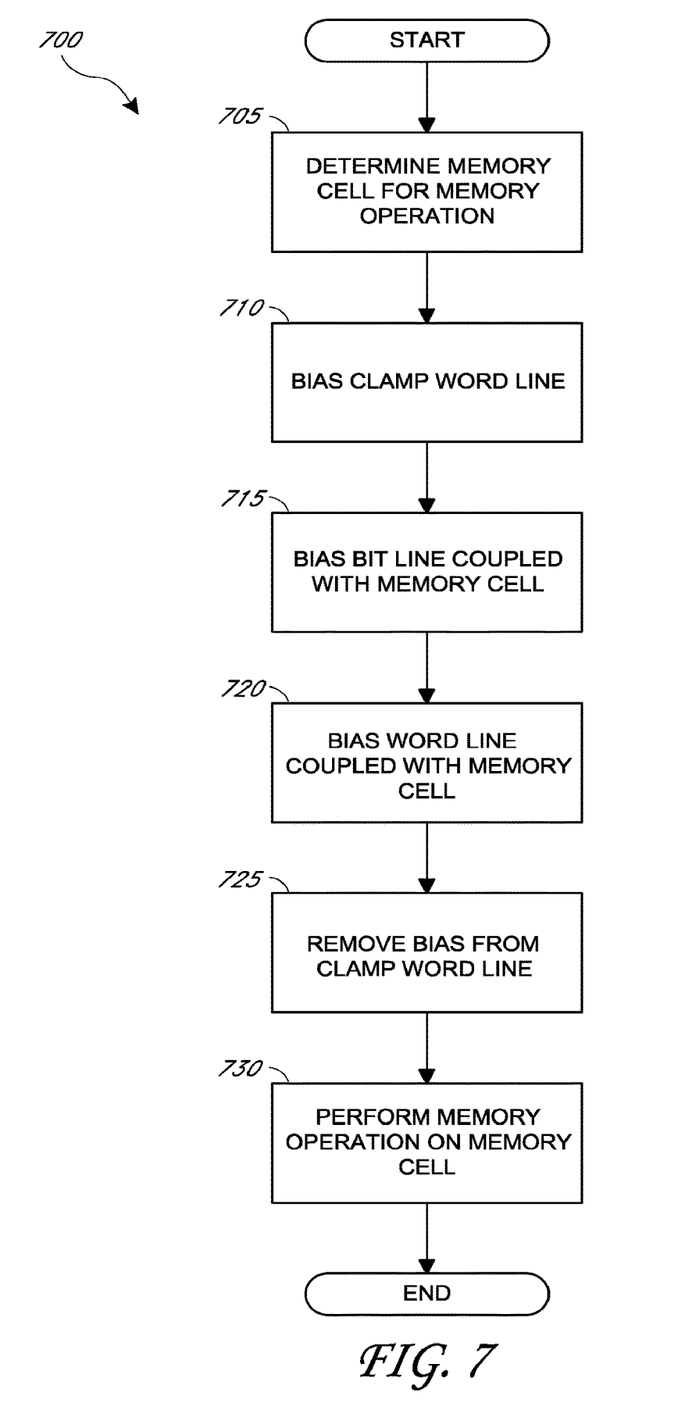
FIG. 7 is an illustration depicting an example process for accessing a memory cell for a memory operation.

FIG. 7 is an illustration depicting an example process 700 for accessing a memory cell for a memory operation. The process 700 can be performed using the architecture 300 of FIG. 3 or the architecture 500 of FIG. 5 under the control of the controller 210, line drivers 220, and access circuit 230 of FIG. 2, for example. The process 700 can enable a memory cell, such as the memory cell 330, to be selected without disturbing neighboring memory cells, such as the memory cells 332 and 334, during a selection and/or access operation.

At block 705, a memory cell is determined for a memory operation. The controller 210 can, for instance, receive a logical address from the host system 250 and determine a corresponding memory cell, such as the memory cell 330, for the received logical address. At block 710, a clamp word line corresponding to the memory cell can be biased. For example, the controller 210 can instruct the line drivers 220 to supply a bias voltage to the word line WL_CLAMP of the architecture 300 to cause the clamp 320 to conduct current. At block 715, a bit line coupled to the determined memory cell can be biased. The controller 210 can, for instance, instruct the line drivers 220 to supply a bias voltage to the bit line BL_SEL of the architecture 300 to select the memory cell 330. At block 720, a word line coupled to the determined memory cell can be biased. The controller 210 can, for instance, instruct the line drivers 220 to supply a bias voltage to the word line WL_SEL of the architecture 300 to select the memory cell 330 and cause the memory cell 330 to conduct current. At block 725, the bias provided to the clamp word line can be removed. In one example, the controller 210 can instruct the line drivers 220 to stop supplying the bias voltage to the word line WL_CLAMP to cause the clamp 320 to stop conducting current. At block 730, the memory operation can be performed on the determined memory cell. For instance, the controller 210 can instruct the access circuits 230 to read or program the memory cell 330.

In one embodiment of the present disclosure, an apparatus can include a memory cell, a digit line driver, an access line driver, a clamping element, and a control circuit. The memory cell can be operatively coupled to a digit line and an access line. The digit line driver can be operatively coupled to the digit line and bias the digit line. The access line driver can be operatively coupled to the access line and bias the access line. The clamping element can be operatively coupled to the digit line and another access line and clamp a voltage of the digit line. The control circuit can cause the clamping element to clamp the voltage of the digit line for a period while the digit line driver is caused to bias the digit line at a voltage level sufficient to enable selection of the memory cell. In addition, the control circuit can cause the access line driver to bias the access line when the voltage of the digit line is at the voltage level sufficient to enable selection of the memory cell.

In another embodiment of the present disclosure, an electronically-implemented method of operating a memory device includes: biasing a digit line to at least a voltage level sufficient to enable a selection of a memory cell, the memory cell being operatively coupled to the first digit line and a first access line; during a period while biasing the digit line, conducting electrical current using a clamping element operatively coupled to the digit line and another access line; and biasing the access line to select the memory cell when the voltage of the digit line is at the voltage level sufficient to enable selection of the memory cell.

The terms, "and", "or", and "and/or" as used herein may include a variety of meanings that also are expected to depend at least in part upon the context in which such terms are used. Typically, "or" if used to associate a list, such as A, B or C, is intended to encompass A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. Though, it should be noted that this is merely an illustrative example and claimed subject matter is not limited to this example.

In the preceding detailed description, numerous specific details have been set forth to provide a thorough understanding of claimed subject matter. However, it will be understood by those skilled in the art that claimed subject matter may be practiced without these specific details. In other instances, methods or apparatuses that would be known by one of ordinary skill have not been described in detail so as not to obscure claimed subject matter.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein.

Therefore, it is intended that claimed subject matter not be limited to the particular examples disclosed, but that such claimed subject matter may also include all aspects falling within the scope of appended claims, and equivalents thereof.

What is claimed is:

1. An apparatus, comprising:
   a memory array comprising a first memory cell and a second memory cell coupled with a digit line; and
   a control circuit coupled with the memory array, the control circuit configured to:
      discharge a first charge from the digit line via the second memory cell during a first time period of an access operation; and
      transfer a second charge to or from the first memory cell via the digit line during a second time period of the access operation, wherein a data state of the first memory cell is based at least in part on the second charge.

2. The apparatus of claim 1, wherein the control circuit is further configured to:
   isolate the second memory cell from the digit line during the second time period.

3. The apparatus of claim 1, wherein the control circuit is further configured to:
   bias the digit line during the first time period and the second time period.

4. The apparatus of claim 1, wherein the control circuit configured to access the first memory cell is further configured to:
   bias a word line that is coupled with the first memory cell during the second time period.

5. The apparatus of claim 4, wherein the control circuit is further configured to:
   bias the digit line to a first voltage that exceeds a first threshold voltage during the first time period, wherein the first voltage of the digit line is based at least in part on the first charge discharged from the digit line during the first time period; and bias the digit line to a second voltage that exceeds the first threshold voltage during the second time period, wherein the second voltage of the digit line is based at least in part on the second charge transferred to or from the first memory cell during the second time period.

6. The apparatus of claim 1, wherein the control circuit is further configured to:

determine the data state of the first memory cell based at least in part on the second charge; or program the data state of the first memory cell based at least in part on the second charge.

7. The apparatus of claim 1, wherein:

the memory array further comprises a third memory cell coupled with a second digit line different than the digit line, the third memory cell being different from the first memory cell and the second memory cell; and the control circuit is further configured to:

bias the digit line during the first time period and the second time period, wherein a voltage is induced on the second digit line during the first time period based at least in part on biasing the digit line; and discharge at least a portion of the voltage induced on the second digit line during the first time period.

8. The apparatus of claim 7, wherein the control circuit is further configured to:

bias a first word line coupled with the second memory cell and the third memory cell during the second time period.

9. The apparatus of claim 1, wherein the memory array further comprises a third memory cell coupled with the digit line, wherein the control circuit is further configured to:

discharge a third charge from the digit line via the third memory cell during a first time period of a second access operation.

10. A method, comprising:

biasing a digit line operatively coupled with a first memory cell and a second memory cell during a first portion and a second portion of an access operation;

discharging a first charge from the digit line via the second memory cell during the first portion of the access operation; and transferring a second charge to or from the first memory cell via the digit line during the second portion of the access operation, wherein a data state of the first memory cell is based at least in part on the second charge.

11. The method of claim 10, further comprising:

determining the data state of the first memory cell based at least in part on the second charge; or programming the data state of the first memory cell based at least in part on the second charge.

12. The method of claim 10, further comprising:

coupling the second memory cell with the digit line during the first portion of the access operation.

13. The method of claim 12, further comprising:

isolating the second memory cell from the digit line during the second portion of the access operation.

14. The method of claim 10, further comprising:

discharging, during the first portion of the access operation, a third charge from a second digit line via a third memory cell coupled with the second digit line, wherein a voltage is induced on the second digit line during the first portion of the access operation based at least in part on biasing the digit line.

15. The method of claim 10, further comprising:

transferring a third charge from the digit line during a first portion of a second access operation via a third memory cell coupled with the digit line.

16. An apparatus, comprising:

a memory array comprising a first memory cell coupled with a first digit line and a second memory cell coupled with a second digit line; and a control circuit coupled with the memory array, the control circuit configured to:

bias the first digit line during a first portion and a second portion of an access operation, wherein a voltage is induced on the second digit line during the first portion of the access operation based at least in part on biasing the first digit line;

discharge, during the first portion of the access operation, at least a portion of the voltage induced on the second digit line via the second memory cell; and transfer, during the second portion of the access operation, a charge to or from the first memory cell via the first digit line, wherein a data state of the first memory cell is based at least in part on the charge.

17. The apparatus of claim 16, further comprising:

a first word line coupled with the first memory cell to selectively couple the first memory cell to the first digit line; and a second word line coupled with the second memory cell to selectively couple the second memory cell to the second digit line, wherein the first word line is different from the second word line.

18. The apparatus of claim 17, wherein the control circuit is further configured to:

bias the second word line during the first portion of the access operation, wherein the at least the portion of the voltage induced on the second digit line is discharged via the second memory cell based at least in part on biasing the second word line.

19. The apparatus of claim 17, wherein the control circuit is further configured to:

bias the first word line during the second portion of the access operation, wherein the charge is transferred to or from the first memory cell based at least in part on biasing the first word line.

20. The apparatus of claim 16, wherein the memory array further comprises:

a third memory cell coupled with a third digit line, wherein the second digit line and the third digit line are adjacent to the first digit line, wherein a second voltage is induced on the third digit line during the first portion of the access operation based at least in part on biasing the first digit line, and the control circuit is further configured to:

discharge, during the first portion of the access operation, at least a portion of the second voltage induced on the third digit line via the third memory cell.

* * * * *